United States Patent [19]

Miyata et al.

[11] 3,829,799

[45] Aug. 13, 1974

[54] SEMICONDUCTOR IMPEDANCE CIRCUIT AND OSCILLATOR USING THE SAME

[75] Inventors: Takeo Miyata; Seiya Hamada, both of Kanagawa-ken; Katsuaki Inoue; Mikito Baba, both of Tokyo, all of Japan

[73] Assignee: Mitsumi Electric Company, Tokyo, Japan

[22] Filed: Aug. 23, 1972

[21] Appl. No.: 283,188

[30] Foreign Application Priority Data

| | | |
|---|---|---|
| Aug. 28, 1971 | Japan | 46-66224 |
| Aug. 17, 1972 | Japan | 47-82527 |
| Aug. 17, 1972 | Japan | 47-82528 |
| Mar. 22, 1972 | Japan | 47-28661 |

[52] U.S. Cl. .......................... 333/80 T, 331/108 A

[51] Int. Cl. ........................ H03b 7/06, H03h 11/00

[58] Field of Search ...................... 333/80, 80 T, 32; 331/108 R, 108 A

[56] References Cited

UNITED STATES PATENTS 3,639,858 2/1972 Miyata et al. ................. 333/80 TX

*Primary Examiner*—James W. Lawrence
*Assistant Examiner*—Marvin Nussbaum
*Attorney, Agent, or Firm*—Marshall & Yeasting

[57] ABSTRACT

A semiconductor impedance conversion circuit which employs a semiconductor circuit consisting of two transistors, three impedance elements or circuits, a DC voltage source and a DC current source and in which a negative impedance conversion function is obtained between two terminals.

An oscillator employing the above semiconductor impedance conversion circuit and an oscillating capacitor.

9 Claims, 12 Drawing Figures

SEMICONDUCTOR IMPEDANCE CIRCUIT AND OSCILLATOR USING THE SAME

BACKGROUND OF THE INVENTION

1. Field of the Invention

This invention relates to a semiconductor impedance conversion circuit and an oscillator using the same.

2. Description of the Prior Art

Various semiconductor impedance conversion circuits have heretofore been proposed but they require many impedance elements or circuits and transistors and exhibit a characteristic dependent upon the temperature dependency of the common base current amplification factor of transistors employed therein.

SUMMARY OF THE INVENTION

The present invention has for its object to provide a semiconductor impedance conversion circuit which employes less impedance elements or circuit and transistors and has no temperature dependency.

With the present invention, it is possible to obtain a simple semiconductor impedance conversion circuit with a semiconductor circuit consisting of two transistors, three impedance elements of circuits and a DC bias source, which is capable of providing a negative impedance conversion function and/or a gyrator function.

Another object of this invention is to provide an oscillator employing the above-mentioned semiconductor impedance conversion circuit.

Other objects, features and advantages of this invention will become apparent from the following description taken in conjunction with the accompanying drawings.

DESCRIPTION OF THE PREFERRED EMBODIMENTS

Figure 1:
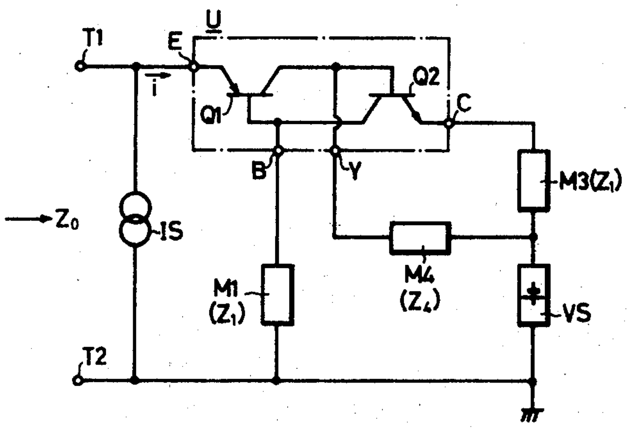
FIGS. 1 and 2 are circuit diagrams showing examples of the basic construction of a semiconductor impedance conversion circuit of this invention.

With reference to FIG. 1 one basic construction of this invention will be described first in detail. Reference character U indicates generally a semiconductor circuit having first, second, third and fourth terminals E, B, Y and C, which includes a PNP-type transistor Q1 and an NPN-type transistor Q2 and in which the emitter of the transistor Q1 is connected to the terminal E, the base of the transistor Q1 and the collector of the transistor Q2 are connected together to the terminal B, the collector of the transistor Q1 and the base of the transistor Q2 are connected together to the terminal Y and the emitter of the transistor Q2 is connected to the terminal C.

The terminal E of the semiconductor circuit U is connected to an external connection terminal T1 and a bias current source IS and an impedance element or circuit M1 are connected between the terminal E and an external connection terminal or common ground terminal T2 and between the terminals B and T2 respectively. Further, the terminals C and Y are respectively connected through impedance elements or circuits M3 and M4 to the one end of a DC bias voltage source VS the other end of which is connected to the terminal T2. In this case, the impedance elements or circuits, M1, M3 and M4 must be so constructed that the terminals B, C and Y are coupled with the voltage source VS in a DC manner respectively.

The foregoing has described one basic construction of this invention. Assuming that an element or circuit M2 (not shown) having an impedance $Z_2$ is connected between the terminals B and Y in the construction of FIG. 1, the impedance $Z_0$ between the terminals T1 and T2 is such as described herein below.

If the common base current amplification factors of the transistors Q1 and Q2 are taken as $\alpha_1$ and $\alpha_2$ respectively, if the voltages between their bases and the emitters are taken as $v_1$ and $v_2$ respectively, if the impedance of the elements or circuits M1, M3 and M4 are taken as $Z_1$, $Z_3$ and $Z_4$ respectively and if a current flowing to the terminal E is taken as $i$, the impedance $Z_0$ between the terminals T1 and T2 is given by the following equation.

$$Z_0 = 1/i[V_1 - Z_1V_2(Z_2\alpha_2 + Z_4)/P_2] - Z_1(P_1/P_2) \quad (1)$$

where $$P_1 = Z_4[Z_2\{(1-\alpha_1)(1 + Z_3/Z_4) - \alpha_2\} + Z_3] \quad (2)$$

$$P_2 = Z_3[Z_2\{Z_4/Z_3(\alpha_2 - 1)\} - Z_1(1 + Z_4/Z_3) - Z_4] \quad (3)$$

Here, $$|(1-\alpha_1)(1 + Z_3/Z_4)| << |\alpha_2| \quad (4)$$

$$|(Z_4/Z_3)(\alpha_2 - 1)| << 1 \quad (5)$$

Accordingly, if the following condition is satisfied:

$$|1-\alpha_1|/(|\alpha_2| - |1-\alpha_1|) << |Z_4|/|Z_3| << |1/(1-\alpha_2)| \quad (6)$$

it follows that $$P_1 = Z_4(-\alpha_2Z_2 + Z_3) \quad (7)$$

$$P_2 = Z_3[-Z_2 - Z_1(1 + Z_4/Z_3) - Z_4] \quad (8)$$

The condition of the equation 6 can be satisfied for the following reason. Namely, if the common emitter current amplification factors of the transistors Q1 and Q2 are taken as $h_{fe1}$ and $h_{fe2}$ respectively, they are given in the following forms:

$$h_{fe1} = \alpha_1 /(1-\alpha_1) \approx 1/(1-\alpha_1) \quad (9)$$

$$h_{fe2} = \alpha_2 /(1-\alpha_2) \approx 1/(1-\alpha_2) \quad (10)$$

Therefore, the equation 6 becomes as follows:

$$\left|\frac{1}{h_{fe1}}\cdot\frac{1}{1-\frac{1}{h_{fe2}}}\right| \ll \left|\frac{Z_4}{Z_3}\right| \ll |h_{fe2}| \quad (11)$$

For example, if $|h_{fe1}| = |h_{fe2}| = 200$, it follows that $$1/200 << Z_4/Z_3 << 200 \quad (11)'$$

and if $Z_3 \approx Z_4$, the condition of the equation 6 may well be satisfied. Accordingly, the third term on the right side of the equation 1 is obtained by the use of the equations 7 and 8 as follows:

$$-Z_1\frac{P_1}{P_2} = -Z_1\frac{Z_4}{Z_3}\left\{1-\frac{(1-\alpha_2)Z_2+Z_3+Z_4+Z_1\left(1+\frac{Z_4}{Z_3}\right)}{Z_2+Z_1\left(1+\frac{Z_4}{Z_3}\right)+Z_4}\right\} \quad (12)$$

where $$|Z_2| << |Z_1(1+Z_4/Z_3)+Z_3| \quad (13)$$

$$|(1-\alpha_2)Z_2| << |Z_3+Z_4+Z_1(1+Z_4/Z_3)| \quad (14)$$

Accordingly, if the following condition is satisfied:

$$|Z_1(1+Z_4/Z_3)+Z_4| << |Z_2| << |1/(1-\alpha_2)[Z_3+Z_4+Z_1(1+Z_4/Z_3)]| \quad (15)$$

the equation 12 becomes as follows:

$$-Z_1\frac{P_1}{P_2} = -Z_1\frac{Z_4}{Z_3}\left\{1-\frac{Z_3+Z_4+Z_1\left(1+\frac{Z_4}{Z_3}\right)}{Z_2}\right\} \quad (16)$$

Rewritten by the use of the equation 10, the equation 15 becomes as follows:

$$|Z_1(1+Z_4/Z_3)+Z_4| << |Z_2| << |h_{fe2}[Z_3+Z_4+Z_1(1+Z_4/Z_3)]| \quad (17)$$

For example, if $|Z_3| = |Z_4| = |Z_1| = 1(k\Omega)$ and if $|h_{fe2}| = 200$, if follows that $$3(k\Omega) << |Z_2| << 800(k\Omega) \quad (18)$$

From the equation 8, it follows that $$P_2 = -Z_2 \cdot Z_3 \quad (19)$$

within a range in which the equation, 15 is satisfied. Accordingly, if the equation 19 is used as the second term on the right side of the equation 1 and if $\alpha_2 \approx 1$, the equation 1 is expressed as follows.

$$Z_0 = \frac{1}{i}\left\{v_1+\frac{Z_1(Z_2+Z_4)}{Z_2Z_3}v_2\right\} - Z_1\frac{Z_4}{Z_3}\left\{1-\frac{Z_3+Z_4+Z_1\left(1+\frac{Z_4}{Z_3}\right)}{Z_2}\right\} \quad (20)$$

By the way, if the absolute value of the first term of the equation 20 is very smaller than that of the second term, that is, for example, if $|Z_3| \approx |Z_4| \approx |Z_1| = 1(K\Omega)$, if $Z_2 = 30(K\Omega)$ and if $v_{1/i} \approx v_{2/i} = 10(\Omega)$, the first and second terms become about $20(\Omega)$ and about $(1(K\Omega)$ respectively. Consequently, in the equation 20 the second term is dominant and $Z_0$ becomes as follows:

$$Z_0 = -Z_1\frac{Z_4}{Z_3}\left\{1-\frac{Z_3+Z_4+Z_1\left(1+\frac{Z_4}{Z_3}\right)}{Z_2}\right\} \quad (21)$$

$$= -Z_1\frac{Z_4}{Z_3}+\frac{Z_1\frac{Z_4}{Z_3}\left\{Z_3+Z_4+Z_1\left(1+\frac{Z_4}{Z_3}\right)\right\}}{Z_2} \quad (22)$$

Accordingly, if $$K_1 = Z_4/Z_3 \quad (23)$$

$$K_2 = Z_1K_1\{Z_3+Z_4+Z_1(1+K_1)\} \quad (24)$$

it follows that $$Z_0 = -K_1Z_1 + K_2/Z_2 \quad (25)$$

By the way, the impedance $Z_0$ between the terminals T1 and T2, given by the equation 25, has been described on the assumption that the element or circuit M2 having the impedance $Z_2$ is connected between the terminals B and Y in FIG. 1. In the construction of this invention shown in FIG. 1, however, the element or circuit M2 is not provided. Accordingly, the impedance $Z_0$ corresponding to the equation 25 according to the construction of FIG. 1 is given by the following equation:

$$Z_0 = -K_1Z_1 \quad (26)$$

which satisfies the following condition in the equation 25:

$$Z_2 = \infty \quad (27)$$

Therefore, with the construction described previously in connection with FIG. 1, it is possible to obtain between the terminals T1 and T2 the impedance, given by the equation 26, which is converted from the impedances $Z_1$, $Z_3$ and $Z_4$ of the elements of circuits M1, M3 and M4. Accordingly, the construction of FIG. 1 has an impedance conversion function including a negative impedance conversion function for $Z_1$.

Figure 2:
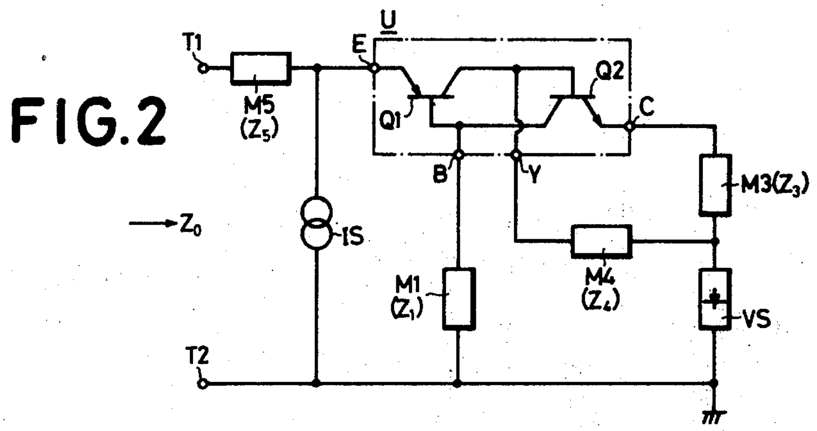

Turning now to FIG. 2, another basic example of this invention will hereinbelow be described, in which parts corresponding to those in FIG. 1 are identified by the same reference characters and no detailed description will be repeated. The present example is identical in construction with the FIG. 1 example except that an impedance element or circuit M5 exhibiting an impedance $Z_5$ is connected in series to the terminal T1 or E in the circuit of FIG. 1.

It will be apparent that, with the construction of FIG. 2, the impedance $Z_0$ viewed from the terminals T1 and T2 becomes as follows:

$$Z_0 = -K_1Z_1 + Z_5 \qquad (28)$$

Accordingly, where the impedance $Z_0$ is expressed in the following form with the values of the real and imaginary parts of $-K_1Z_1$ being taken as $-R$in and $j$ Xin respectively:

$$Z_0 = -K_1Z_1 = -R\text{in} + jX\text{in} \qquad (29)$$

if $Z_5$ is taken as follows:

$$Z_5 = +R\text{in} \qquad (30)$$

the equation 29 is becomes as follows:

$$Z_0 = -K_1Z_1 = jX\text{in} \qquad (31)$$

Thus, the impedance $Z_0$ between the terminals T1 and T2 is obtained as an impedance based on an inductive reactance expressed by Xin.

Figure 3:
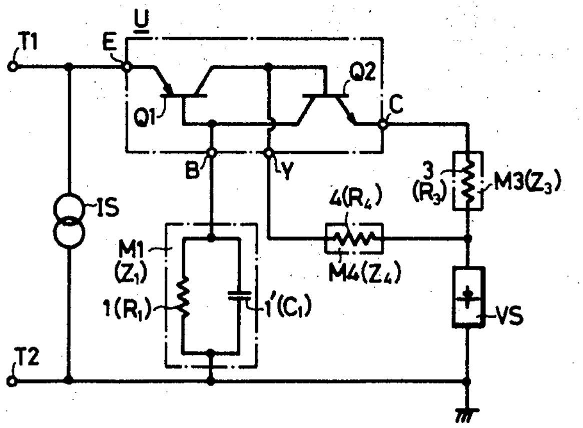
FIGS. 3 to 8, inclusive, are circuit diagrams illustrating concrete examples of the semiconductor impedance conversion circuit of this invention.

Referring now to FIG. 3, a concrete example of this invention will hereinbelow be described, which is based on the basic construction depicted in FIG. 1. In the illustrated example parts corresponding to those in FIG. 1 are marked with the same reference characters and no detailed description will be given. The element or circuit M1 is formed with a resistor 1 having a resistance R1 and a capacitance element 1' having a capacitance $C_1$ and the elements or circuits M3 and M4 are formed with resistors 3 and 4 having resistances $R_3$ and $R_4$ respectively.

With such a construction, the impedance $Z_1$ of the element or circuit M1 is given by the following equation:

$$Z_1 = (R_1 - j\omega C_1R_1^2)/(1+(\omega C_1R_1)^2) \qquad (32)$$

where $\omega$ is an operating angular frequency. In this case, if $R_1$ and $C_1$ are selected to obtain the following relation:

$$(\omega C_1R_1)^2 << 1 \qquad (33)$$

the equation 32 becomes as follows:

$$Z_1 \approx R_1 - j\omega C_1R_1^2 \qquad (34)$$

Further, the impedances $Z_3$ and $Z_4$ are expressed by $R_3$ and $R_4$ respectively. Accordingly, in this case, if $R_1$, $1/j\omega C_1$, $R_3$ and $R_4$ are suitably selected in a manner to provide conditions similar to those for obtaining the aforementioned equation 25, the impedance $Z_0$ between the terminals T1 and T2 becomes from the equation 27 as follows:

$$\begin{aligned} Z_0 &= -K_1Z_1 \\ &= -(Z_4/Z_3)\cdot Z_1 \\ &= -(R_4/R_3)(R_1 - j\omega C_1R_1^2) \\ &= -(R_4/R_3)\ R_1 + j\omega C_1R_1^2\cdot(R_4/R_3) \end{aligned} \qquad (35)$$

Therefore, the construction shown in FIG. 3 exhibits between the terminals T1 and T2 a series impedance of the negative resistance Rin and the inductive reactance Xin, that is, the inductance L, expressed as follows:

$$R\text{in} = -(R_4/R_3)\cdot R_1 \qquad (36a)$$

$$X\text{in}/\omega = L = C_1\cdot R_1^2\cdot(R_4/R_3) \qquad (36b)$$

Since the impedance $Z_0$ in this case is obtained independently of the common base current amplification factors $\alpha_1$ and $\alpha_2$ of the transistors Q1 and Q2 of the semiconductor circuit U, it is possible to obtain the impedance free from temperature dependency, even if the common base current amplification factors $\alpha_1$ and $\alpha_2$ have temperature dependency.

Figure 4:
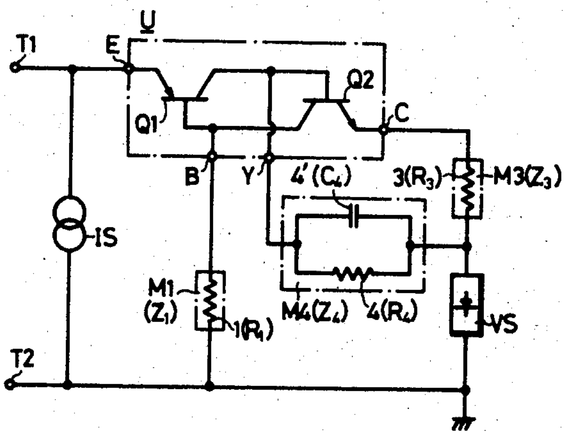

In FIG. 4 there is shown another example of this invention. The present example is based on the construction depicted in FIG. 1 and parts corresponding to those in FIG. 1 are indicated by the same reference characters and no detailed description will be repeated. The element or circuit M4 is formed with a parallel circuit of a resistor 4 having a resistance $R_4$ and a capacitor 4' having a capacitance $C_4$ and the elements or circuits M1 and M3 are formed with resistors 1 and 3 having resistances $R_1$ and $R_3$ respectively.

With such an arrangement, the impedance $Z_4$ of the element or circuit M4 is given by the following equation:

$$Z_4 = (R_4 - j\omega C_4R_4^2)/[1 + (\omega C_4R_4)^2] \qquad (37)$$

In this case, if $R_4$ and $C_4$ are selected to obtain the following relation:

$$(\omega C_4R_4)^2 << 1 \qquad (38)$$

the equation 37 becomes as follows:

$$Z_4 \approx R_4 - j\omega C_4R_4^2 \qquad (39)$$

Further, the impedances $Z_1$ and $Z_3$ of are represented by $R_1$ and $R_3$ respectively. Accordingly, if $R_4$, $1/j\omega C_4$, $R_1$ and $R_3$ are suitably selected in a manner to provide conditions similar to those for obtaining the aforementioned equation 25, the impedance $Z_0$ between the terminals T1 and T2 becomes from the equation 27 as follows:

$$\begin{aligned} Z_0 &= -K_1 Z_1 \\ &= -(Z_4/Z_3)\cdot Z_1 \\ &= -[(R_4 - j\omega C_4 R_4^2)/R_3]\cdot R_1 \\ &= -(R_4/R_3)\cdot R_1 + j\omega C_4 R_4^{2}\cdot(R_1/R_3) \end{aligned} \tag{40}$$

Therefore, the circuit of such a construction as depicted in FIG. 4 presents between the terminals T1 and T2 a series impedance of a negative resistance Rin and inductance L expressed as follows:

$$R\text{in} = -(R_4/R_3)\cdot R_1 \tag{41a}$$

$$X\text{in}/\omega = L = C_4\cdot R_4^{2}\cdot(R_1/R_3) \tag{41b}$$

Also in this case, the impedance is obtained as a value excluding the common base current amplification factors $\alpha_1$ and $\alpha_2$ of the transistors Q1 and Q2 of the semiconductor circuit U, so that the impedance can be obtained independently of temperature.

Figure 5:
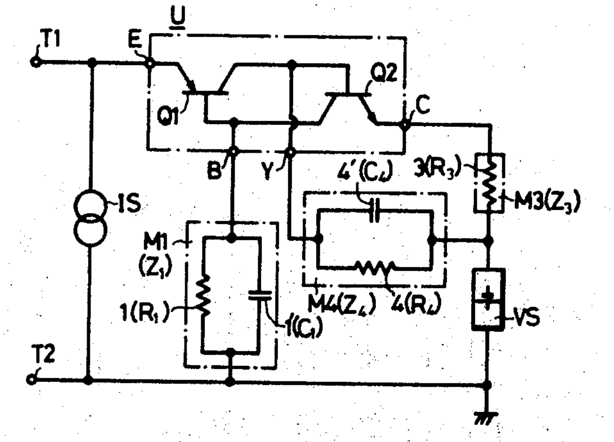

Referring to FIG. 5, another example of this invention will be described. The present example is the combination of the constructions illustrated in FIGS. 3 and 4 and parts corresponding to those in FIGS. 3 and 4 are identified by the same reference numerals and characters and no detailed description will be repeated. In this example, the element or circuit M1 is formed with a parallel circuit of a resistor 1 and a capacitor 1', the element or circuit M4 is also formed with a parallel circuit of a resistor 4 and a capacitor 4' and the element or circuit M4 is formed with a resistor 3.

With such a construction, the impedances $Z_1$ and $Z_4$ of the elements or circuits M1 and M4 are expressed by the aforementioned equations 32 and 37 respectively but if the conditions of the equations 33 and 38 are satisfied, they are expressed by the equations 34 and 39. Accordingly, from the equation 27 the impedance $Z_0$ between the terminals T1 and T2 is given in the following form:

$$\begin{aligned} Z_0 &= -K_1 Z_1 \\ &= -(Z_4/Z_3)\cdot Z_1 \\ &= -[(R_4 - j\omega C_4 R_4^2)/R_3]\cdot(R_1 - j\omega C_1 R_1^2) \\ &= -(1/R_3)(R_1R_4 - \omega^2 C_1 C_4 R_1^2 R_4^2) + j\omega(R_1R_4/R_3)(C_1R_1 + C_4R_4) \end{aligned} \tag{42}$$

Therefore, the circuit of the construction shown in FIG. 5 presents between the terminals T1 and T2 a series impedance of a negative resistance Rin and an inductance L expressed by the following equations:

$$R\text{in} = -(1/R_3)(R_1R_4 - \omega^2 C_1 C_4 R_1^2 R_4^2) \tag{43a}$$

$$X\text{in}/\omega = L = (R_1R_4/R_3)(C_1R_1\ 30\ C_4R_4) \tag{43b}$$

The inductance L in this case is obtained as the sum of those obtainable in the cases of FIGS. 3 and 4, so that it is possible to obtain a large inductance in this case.

Further, with the construction of FIG. 5, if $R_1$, $R_4$, $C_1$ and $C_4$ are suitably selected so as to obtain the following relation:

$$\omega^2 C_1 C_4 R_1 R_4 = 1 \tag{44}$$

the right side of the equation 43a becomes zero. Namely, $R\text{in} = 0$, and accordingly, from the equation 42, it follows that $$Z_0 = j\omega(R_1R_4/R_3)(C_1R_1 + C_4R_4) \tag{45}$$

Therefore, the circuit of the construction of FIG. 5 provides between the terminals T1 and T2 an impedance based on a pure inductance given by the equation (43b).

Figure 6:
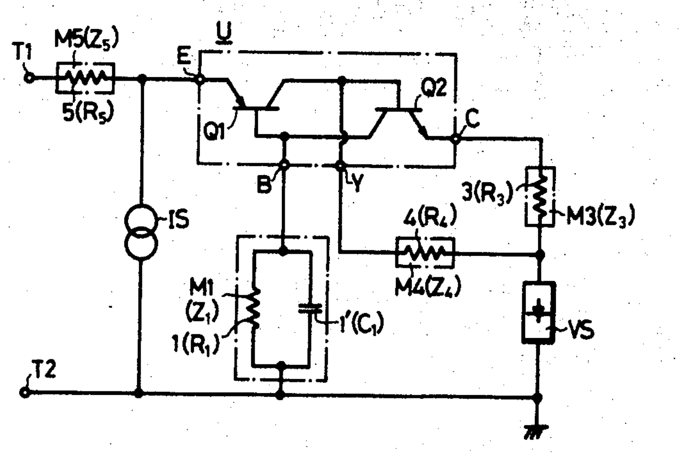

FIG. 6 shows another example of this invention, which is constructed based on the fundamental construction of FIG. 2 and in which parts corresponding to those in FIG. 2 are designated by the same reference characters and no detailed description will be given thereof. The elements or circuits M1, M3 and M4 are formed in the same manner as in the example of FIG. 3 and the element or circuit M5 is formed with a resistor 5 having a resistance $R_5$.

With the construction of FIG. 6, if the impedance of the element or circuit M1 is assumed to be that given by the aforementioned equation 33, the impedance $Z_0$ between the terminals T1 and T2 is given in the following form from the aforesaid equation 28:

$$\begin{aligned} Z_0 &= -K_1 Z_1 + Z_5 \\ &= -(R_4/R_3)\cdot R_1 + j\omega C_1 R_1^{2}\cdot(R_4/R_3) + R_5 \end{aligned} \tag{46}$$

Accordingly, if $R_1$, $R_3$, $R_4$ and $R_5$ are suitably selected to obtain the following relation:

$$R_5 = (R_4/R_3)\cdot R_1 \tag{47}$$

the impedance $Z_0$ given by the equation 46 becomes as follows:

$$Z_0 = j\omega C_1 R_1^{2}\cdot(R_4/R_3) \tag{48}$$

and the pure inductance given by the aforementioned equation 36b is obtained.

Figure 7:
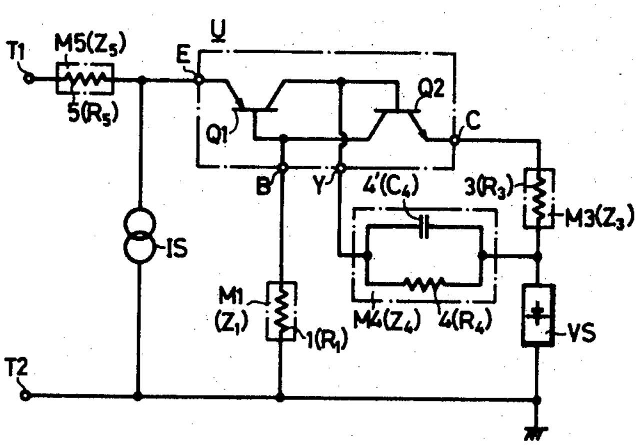

Turning now to FIG. 7, another example of this invention will be described, which is based on the fundamental construction of this invention shown in FIG. 2. In the present example, the elements or circuits M1, M3 and M4 are formed in the same manner as in the example of FIG. 4 and the element or circuit M5 is formed with the resistor 5 in the same manner as in the case of FIG. 6.

With such a construction as depicted in FIG. 7, if the impedance $Z_4$ of the element or circuit M4 is assumed to be that expressed by the equation 39, the impedance between the terminals T1 and T2 is given in the following form from the aforementioned equation 28:

$$\begin{aligned} Z_0 &= -K_1 Z_1 + Z_5 \\ &= -(R_4/R_3)\cdot R_1 + j\omega C_4 R_4^{2}\cdot(R_1/R_3) + R_5 \end{aligned} \tag{49}$$

Accordingly, under the condition of the aforesaid equation 47 the impedance $Z_0$ given by the equation 49 becomes as follows:

$$Z_0 = j\omega C_4 R_4^2 \cdot (R_1/R_3) \quad (50)$$

and the pure inductance given by the aforesaid equation 41*b* is obtained.

Figure 8:
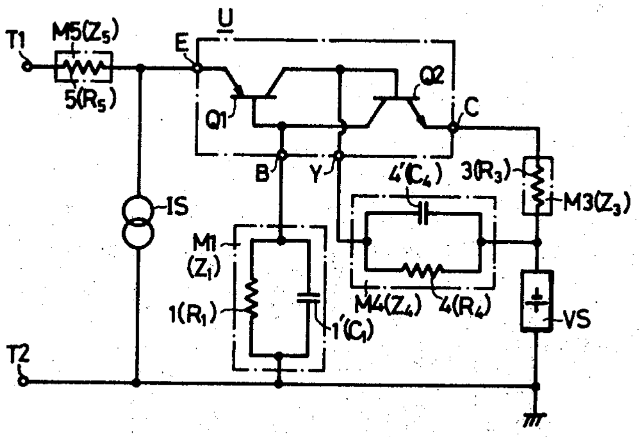

FIG. 8 illustrates another example of this invention, which is the combination of the constructions depicted in FIGS. 6 and 7 and in which parts corresponding to those in FIGS. 6 and 7 are identified by the same reference numerals and characters and no detailed description will be given therefore. In the present example, the element or circuit M1 is formed with a parallel circuit of a resistor 1 and a capacitor 1', the element or circuit M4 is also formed with a parallel circuit of a resistor 4 and a capacitor 4' and the elements or circuits M3 and M5 are formed with resistors 3 and 5 respectively.

With such an arrangement, assuming that the impedances $Z_1$ and $Z_4$ of the elements or circuits M1 and M4 are those expressed by the aforementioned equations 34 and 39 respectively, the impedance $Z_0$ between the terminals T1 and T2 is given in the following form from the aforesaid equation 28:

$$Z_0 = -(1/R_3)(R_1R_4 - \omega^2 C_1 C_4 R_1^2 R_4^2) + j\omega(R_1R_4/R_3)(C_1R_1 + C_4R_4) + R_5 \quad (51)$$

Accordingly, if the following condition $$R_5 = \left|(1/R_3)(R_1R_4 - \omega^2 C_1 C_4 R_1^2 R_4^2)\right| \quad (52)$$

is satisfied, the impedance $Z_0$ given by the equation 51 becomes the aforementioned equation 45 to provide the pure inductance.

Figure 9:
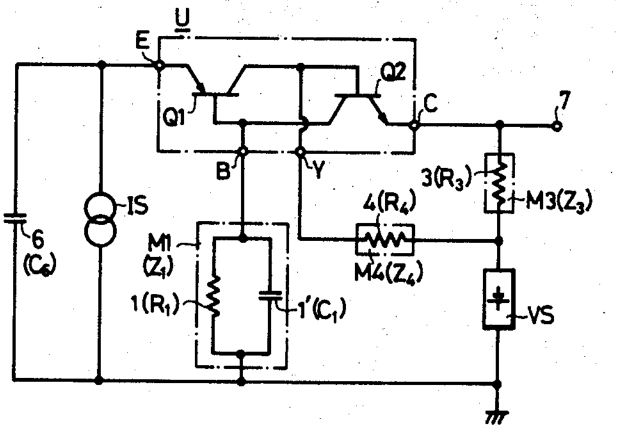
FIGS. 9, 10 and 11, inclusive, are circuit diagrams showing examples of an oscillator employing the semiconductor impedance conversion circuits depicted in FIGS. 3, 4 and 5 repectively.

In FIG. 9 there is depicted another example of this invention, which is idential in construction with the example of FIG. 3 except that a capacitor 6 having a capacitance $C_6$ is connected between the terminal E and the ground and that the terminals T1 and T2 are left out.

With the construction of this example, if the capacitor 6 is not present, the impedance between the terminal E and the ground is obtained as an impedance of a series circuit consisting of the negative resistance given by the equation 36*a* and the inductance given by the equation 36*b*. As a result of this, the circuit can oscillate at a frequency determined chiefly by the inductance L given by the equation 36*b* and $C_6$ and the oscillation output can be derived, for example, between the terminal 7 led out from the terminal C and the ground. Since the constants determining the oscillation frequency are independent of the common base current amplification factors of the transistors Q1 and Q2 as will be seen from the foregoing, the oscillation frequency in this case can be obtained independently of temperature.

Figure 10:
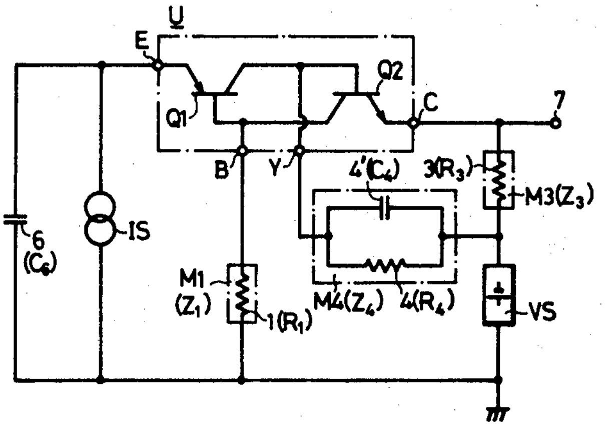
Figure 11:
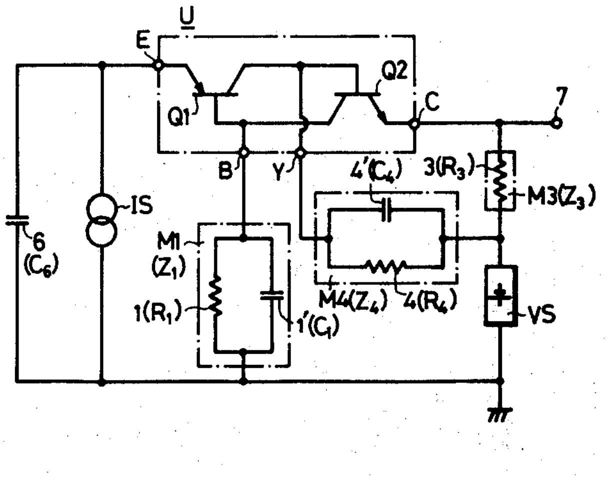

With reference to FIG. 10 and 11 other examples of this invention will be described, in which a capacitor 6 is connected between the terminal E and the ground and an output terminal 7 is led out from the terminal C in the constructions of FIG. 4 and 5, as in the example of FIG. 9.

With the construction shown in FIG. 10, it is possible to derive from the terminal 7 an oscillation output having an oscillation frequency determined mainly by the inductance L given by the equation 41*b* and the capacitance $C_6$ of the capacitor 6. While, with tthe construction of FIG. 11, it is possible to derive from the terminal 7 an oscillation output having an oscillation frequency determined chiefly by the inductance L given by the equation 43*b* and the capacitance $C_6$ of the capacitor 6.

Figure 12:
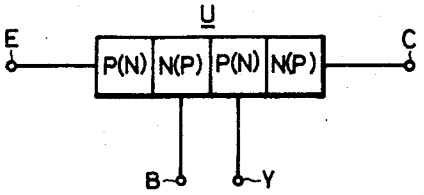
FIG. 12 is a schematic diagram showing another example of a semiconductor circuit employed in this invention.

While the present invention has been described in connection with the case where the transistors Q1 and Q2 of the semiconductor circuit U are PNP- and NPN-types respectively, they may be NPN- and PNP-types respectively where the bias voltage source, the bias current source and so on mentioned in the foregoing are reversed in polarity. Further, the semiconductor circuit U consisting of two transistors may be replaced with a circuit equivalent thereto which is formed with a PNPN- (or NPNP-) type transistor such as shown in FIG. 12 in which the terminals E, B, Y and C are connected to the layers respectively. Moreover, in the foregoing examples, the bias voltages applied between the terminals Y and B and between C and B are derived from the common bias voltage source but they may be derived from separate bias voltage sources. In addition, the bias voltage source, which is connected between the connection point of the elements or circuits M4 and M3 and the ground in the foregoing, may be connected in series to the element or circuit M1 on the side of the ground.

It will be apparent that many modifications and variations may be effected without departing from the scope of the novel concepts of this invention.

We claim as our invention

1. A semiconductor impedance conversion circuit comprising a semiconductor circuit or a circuit equivalent thereto, the semiconductor circuit including a first transistor of a first conductivity type and a second transistor of a second conductivity type, the emitter of the first transistor being connected to a first terminal, the base of the first transistor and the collector of the second transistor being connected together to a second terminal, the emitter of the second transistor being connected to a third terminal and the collector of the first transistor and the base of the second transistor being connected together to a fourth terminal, a first impedance element or circuit connected between the second terminal and a common terminal, a second impedance element or circuit connected between the third and the common terminal, a third impedance element or circuit connected between the fourth and common terminals, and a DC bias source for the semiconductor circuit or the circuit equivalent thereto, which is characterized in that an impedance $Z_0$ between the first and common terminals expressed as follows:

$$Z_0 = -K_1 Z_1$$

$$K_1 = Z_4/Z_3$$

is obtained, where $Z_1$, $Z_3$ and $Z_4$ are impedances of the first, second and third impedance elements or circuits.

2. A semiconductor impedance conversion circuit comprising a semiconductor circuit or a circuit equivalent thereto, the semiconductor circuit including a first transistor of a first conductivity type and a second transistor of a second conductivity type, the emitter of the first transistor being connected to a first terminal, the base of the first transistor and the collector of the second transistor being connected together to a second terminal, the emitter of the second transistor being connected to a third terminal and the collector of the first transistor and the base of the second transistor being connected together to a fourth terminal, a first impedance element or circuit connected between the second terminal and a common terminal, a second impedance element or circuit connected between the third and the common terminal, a third impedance element or circuit connected between the fourth and common terminals, a DC bias source for the semiconductor circuit or the circuit equivalent thereto, and a fourth impedance element or circuit connected at one end to the first terminal, which is characterized in that an impedance $Z_0$ between the other end of the fourth impedance element or circuit and the common terminal expressed as follows:

$$Z_0 = -K_1Z_1 + Z_5$$

$$K_1 = Z_4/Z_3$$

is obtained, where $Z_1$, $Z_3$, $Z_4$ and $Z_5$ are impedances of the first, second, third and fourth impedance elements or circuits.

3. A semiconductor impedance conversion circuit according to claim 1, wherein the first impedance element or circuit is a parallel circuit consisting of a first resistor and a first capacitor and the second and third impedance elements or circuits are second and third resistors respectively and wherein, under the following condition, $$(\omega C_1R_1)^2 << 1$$

the impedance $Z_0$ is expressed as follows:

$$Z_0 = -K_1Z_1$$
$$= -(R_4/R_3)\ R_1 + j\omega C_1R_1^2(R_4/R_3)$$

where $R_1$, $R_3$ and $R_4$ are the resistances of the first, second and third resistors respectively, $C_1$ is the capacitance of the first capacitor and $\omega$ is an operating angular frequency.

4. A semiconductor impedance conversion circuit according to claim 1, wherein the first and second impedance elements or circuits are first and second resistors respectively and the third impedance element or circuit is a parallel circuit consisting of a third resistor and a third capacitor and wherein, under the following condition:

$$(\omega C_4R_4)^2 << 1$$

the impedance $Z_0$ is expressed as follows:

$$Z_0 = -K_1Z_1$$
$$= -(R_4/R_3)\ R_1 + j\omega C_4R_4^2(R_1/R_3)$$

where $R_1$, $R_3$ and $R_4$ are the resistances of the first, second and third resistors respectively, $C_4$ is the capacitance of the third capacitor and $\omega$ is an operating angular frequency.

5. A semiconductor impedance conversion circuit according to claim 1, wherein the first impedance element or circuit is a parallel circuit consisting of a first resistor and a first capacitor, the second impedance element or circuit is a second resistor and the third impedance element or circuit is a parallel circuit consisting of a third resistor and a third capacitor, and wherein, under the following conditions:

$$(\omega C_1R_1)^2 << 1$$
$$(\omega C_4R_4)^2 << 1$$

the impedance $Z_0$ is expressed as follows:

$$Z_0 = -K_1Z_1$$
$$= -(1/R_3)(R_1R_4 - \omega^2C_1C_4R_1^2R_4^2) + j\omega(R_1R_4/R_3)(C_1R_1 + C_4R_4)$$

where $R_1$, $R_3$ and $R_4$ are the resistances of the first, second and third resistors respectively, $C_1$ and $C_4$ are the capacitances of the first and third capacitors respectively and $\omega$ is an operating angular frequency.

6. A semiconductor impedance conversion circuit according to claim 5, wherein, under the following condition:

$$\omega^2C_1C_4R_1R_4 = 1$$

the impedance $Z_0$ is expressed as follows:

$$Z_0 = j\omega(R_1R_4/R_3)(C_1R_1 + C_4R_4)$$

7. A semiconductor impedance conversion circuit according to claim 2, wherein the first impedance element or circuit is a parallel circuit consisting of a first resistor and a first capacitor and the second, third and fourth impedance elements or circuits are second, third and fourth resistors respectively and wherein, under the following conditions, $$(\omega C_1R_1)^2 << 1,\ R_5 = |(R_4/R_3)\ R_1|$$

the impedance $Z_0$ is expressed as follows:

$$Z_0 = -K_1Z_1 + Z_5$$
$$= j\omega C_1R_1^2(R_4/R_3)$$

where $R_1$, $R_3$, $R_4$ and $R_5$ are the resistances of the first, second, third and fourth resistors respectively, $C_1$ is the capacitance of the first capacitor and $\omega$ is an operating angular frequency.

8. A semiconductor impedance conversion circuit according to claim 2, wherein the first, second and fourth impedance elements or circuits are first, second and fourth resistors respectively and the third impedance element or circuit is a parallel circuit consisting of a third resistor and a third capacitor and wherein, under the following conditions:

$$(\omega C_4R_4)^2 << 1,\ R_5 = (R_4/R_3)\ R_1$$

the impedance $Z_0$ is expressed as follows:

$$Z_0 = -K_1Z_1 + Z_5$$
$$= j\omega C_4R_4^2(R_1/R_3)$$

where $R_1$, $R_3$, $R_4$ and $R_5$ are the resistances of the first, second, third and fourth resistors respectively, $C_4$ is the capacitance of the third capacitor and $\omega$ is an operating angular frequency.

9. A semiconductor impedance conversion circuit according to claim 2, wherein the first impedance element or circuit is a parallel circuit consisting of a first resistor and a first capacitor, the second and fourth impedance elements or circuits are second and fourth resistors respectively and the third impedance element or circuit is a parallel circuit consisting of a third resistor and a third capacitor, and wherein, under the following conditions:

$$(\omega C_1R_1)^2 << 1$$
$$(\omega C_4R_4)^2 << 1$$
$$R_5 = |(1/R_3)(R_1R_4 - \omega^2C_1C_4R_1^2R_4^2)|$$

the impedance $Z_0$ is expressed as follows:

$$Z_0 = -K_1Z_1 + Z_5$$
$$= j\omega(R_1R_4/R_3)(C_1R_1 + C_4R_4)$$

where $R_1$, $R_3$, $R_4$ and $R_5$ are the resistances of the first, second, third and fourth resistors respectively, $C_1$ and $C_4$ are the capacitances of the first and third capacitors respectively and $\omega$ is an operating angular frequency.

* * * * *